US012813141B2

(12) United States Patent
Kwon et al.

(10) Patent No.: US 12,813,141 B2
(45) Date of Patent: Nov. 24, 2026

(54) DISPLAY APPARATUS

(71) Applicant: Samsung Display Co., LTD., Yongin-si (KR)

(72) Inventors: Ohjune Kwon, Yongin-si (KR); Seungwook Kwon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 477 days.

(21) Appl. No.: 18/385,276

(22) Filed: Oct. 30, 2023

(65) Prior Publication Data

US 2024/0215398 A1 Jun. 27, 2024

(30) Foreign Application Priority Data

Dec. 21, 2022 (KR) ........................ 10-2022-0180883

(51) Int. Cl.
*H10K 50/844* (2023.01)
*H10K 59/12* (2023.01)
*H10K 59/80* (2023.01)

(52) U.S. Cl.
CPC ................................ *H10K 59/8731* (2023.02)

(58) Field of Classification Search
CPC ... H10K 50/844; H10K 50/8445; H10K 59/12
See application file for complete search history.

(56) References Cited

U.S. PATENT DOCUMENTS 8,344,396 B2 1/2013 Shim et al.
9,136,502 B2 9/2015 Kwack et al.
11,424,300 B2 8/2022 Bang et al.
11,600,686 B2 3/2023 Won et al.
2017/0128732 A1* 5/2017 Schotzko ............. A61N 1/0587
2018/0076417 A1* 3/2018 Song .................. H10K 59/8731
2019/0355929 A1 11/2019 Xu
(Continued)

FOREIGN PATENT DOCUMENTS

CN 109950421 A * 6/2019
CN 114592179 A 6/2022
CN 114639792 A 6/2022
(Continued)

OTHER PUBLICATIONS

Venu G. Varanasi, et al., "Role of Hydrogen and Nitrogen on the Surface Chemical Structure of Bioactive Amorphous Silicon Oxynitride Films", The Journal of Physics Chemistry, J. Phys. Chem. B, DOI: 10.1021/acs.jpcb.7b05885; Aug. 21, 2017.

*Primary Examiner* — Joseph L Williams
(74) *Attorney, Agent, or Firm* — CANTOR COLBURN LLP

(57) ABSTRACT

A display apparatus includes a substrate including a display area and a peripheral area around the display area, a display element disposed on the substrate in the display area, and a thin-film encapsulation layer covering the display element, where the thin-film encapsulation layer includes a first inorganic encapsulation layer and a second inorganic encapsulation layer disposed on the first inorganic encapsulation layer. An end of one of the first inorganic encapsulation layer and the second inorganic encapsulation layer having a higher surface energy than the other thereof extends further in a direction from the display area toward the peripheral area than an end of the other thereof.

20 Claims, 15 Drawing Sheets

(56) References Cited

U.S. PATENT DOCUMENTS

| | | | | |
|---|---|---|---|---|
| 2023/0080648 A1* | 3/2023 | Min | H10K 50/844 257/40 |
| 2025/0089532 A1* | 3/2025 | Kwon | H10K 59/8731 |

FOREIGN PATENT DOCUMENTS

| | | | |
|---|---|---|---|
| KR | 101015851 | B1 | 2/2011 |
| KR | 101713277 | B1 | 3/2017 |
| KR | 1020210072198 | A | 6/2021 |
| KR | 1020220080067 | A | 6/2022 |

* cited by examiner

DISPLAY APPARATUS

This application claims priority to Korean Patent Application No. 10-2022-0180883, filed on Dec. 21, 2022, and all the benefits accruing therefrom under 35 U.S.C. § 119, the content of which in its entirety is herein incorporated by reference.

BACKGROUND

1. Field

One or more embodiments relate to display apparatuses.

2. Description of the Related Art

As the information society develops, demands for display apparatuses for displaying images are increasing in various forms. The field of display apparatuses has rapidly changed to a flat panel display device (FPD) that is thin, light in weight, and capable of large area, replacing a bulky cathode ray tube (CRT). FPDs may include liquid crystal display panels (PDPs), plasma display panels (PDPs), organic light-emitting display devices (OLEDs), and electrophoretic display devices (EDs).

From among display apparatuses, an OLED may include an organic light-emitting diode including an opposite electrode, a pixel electrode, and an emission layer. When a voltage is applied to the opposite electrode and the pixel electrode of the organic light-emitting diode, visible light is extracted from the emission layer.

The OLED may include organic light-emitting diodes that implement red, green, and blue visible light to realize a natural color screen, and an emission layer of each of the organic light-emitting diodes may be formed by using an inkjet printing manufacturing method or the like.

In addition, the display apparatus may include a display area on which an image is implemented, and a peripheral area on which an image is not implemented. Recently, research to expand the display area by reducing an area of the peripheral area where lines and the like of the display apparatus are arranged has been actively conducted.

SUMMARY

One or more embodiments include a display apparatus with improved reliability and reduced non-display area.

According to one or more embodiments, a display apparatus includes a substrate including a display area and a peripheral area around the display area, a display element disposed on the substrate in the display area, and a thin-film encapsulation layer covering the display element, where the thin-film encapsulation layer includes a first inorganic encapsulation layer and a second inorganic encapsulation layer disposed on the first inorganic encapsulation layer. In such an embodiment, an end of one of the first inorganic encapsulation layer and the second inorganic encapsulation layer extends further in a direction from the display area toward the peripheral area than an end of the other thereof, where the one of the first inorganic encapsulation layer and the second inorganic encapsulation layer has a higher surface energy than the other thereof.

In an embodiment, the display apparatus may further include an organic film layer disposed on the thin-film encapsulation layer and having a higher surface energy than the first inorganic encapsulation layer and the second inorganic encapsulation layer, where an end of the organic film layer may extend further in a direction from the display area toward the peripheral area than ends of the first inorganic encapsulation layer and the second inorganic encapsulation layer.

In an embodiment, the first inorganic encapsulation layer may have a higher surface energy than the second inorganic encapsulation layer, and the second inorganic encapsulation layer may expose an end portion of the first inorganic encapsulation layer.

In an embodiment, the first inorganic encapsulation layer may include silicon oxide or silicon oxynitride, and the second inorganic encapsulation layer includes silicon nitride.

In an embodiment, the first inorganic encapsulation layer may be thicker than the second inorganic encapsulation layer.

In an embodiment, the second inorganic encapsulation layer may have a higher surface energy than the first inorganic encapsulation layer, and the second inorganic encapsulation layer covers an end of the first inorganic encapsulation layer.

In an embodiment, the display apparatus may further include a coating layer disposed directly on the thin-film encapsulation layer, where the coating layer may include a resin, and an end of the coating layer is aligned with the end of the one of the first inorganic encapsulation layer and the second inorganic encapsulation layer having the higher surface energy.

In an embodiment, an edge of the thin-film encapsulation layer may include a first side extending in a first direction, a second side extending in a second direction in a plan view, and a corner portion where the first side and the second side meet each other, and the end of the one of the first inorganic encapsulation layer and the second inorganic encapsulation layer having the higher surface energy and extending further in the direction from the display area toward the peripheral area than the end of the other thereof may be in the corner portion of the thin-film encapsulation layer.

In an embodiment, the first inorganic encapsulation layer may have a shape protruding from the corner portion of the thin-film encapsulation layer.

In an embodiment, the first inorganic encapsulation layer may have an angular edge, the second inorganic encapsulation layer has a round edge, and the second inorganic encapsulation layer may expose a portion of the angular edge of the first inorganic encapsulation layer.

In an embodiment, the display apparatus may further include a dam portion disposed on the substrate and positioned in the peripheral area, where the first inorganic encapsulation layer and the second inorganic encapsulation layer may cover the dam portion.

In an embodiment, a distance between the end of the one of the first inorganic encapsulation layer and the second inorganic encapsulation layer having the higher surface energy and the dam portion may be greater than a distance between the end of the other thereof and the dam portion.

In an embodiment, the first inorganic encapsulation layer and the second inorganic encapsulation layer may be in direct contact with each other in the peripheral area.

In an embodiment, the display element may include a pixel electrode, an emission layer, and an opposite electrode.

According to one or more embodiments, a display apparatus includes a substrate including a display area and a peripheral area around the display area, a display element disposed on the substrate in the display area, where the display element includes a pixel electrode, an emission layer, and an opposite electrode, a thin-film encapsulation layer including a first inorganic encapsulation layer, an organic encapsulation layer, and a second inorganic encapsulation layer, which are sequentially disposed on the display element, and a dam portion disposed on the substrate and positioned in the peripheral area. In such an embodiment, an edge of the thin-film encapsulation layer includes a first side extending in a first direction, a second side extending in a second direction in a plan view, and a corner portion where the first side and the second side meet each other, and an end of the first inorganic encapsulation layer in the corner portion extends further in a direction from the display area toward the peripheral area than an end of the second inorganic encapsulation layer in the corner portion.

In an embodiment, the second inorganic encapsulation layer in the corner portion may expose the first inorganic encapsulation layer in the corner portion.

In an embodiment, the dam portion may be arranged to surround the display area, and a distance between the end of the second inorganic encapsulation layer in the corner portion and the dam portion may be less than a distance between the end of the first inorganic encapsulation layer in the corner portion and the dam portion.

In an embodiment, the first inorganic encapsulation layer may have a higher surface energy than the second inorganic encapsulation layer.

In an embodiment, the first inorganic encapsulation layer may include silicon oxide or silicon oxynitride, and the second inorganic encapsulation layer may include silicon nitride.

In an embodiment, the display apparatus may further include a coating layer disposed on the second inorganic encapsulation layer, where the coating layer may include a resin, and an end of the coating layer may be aligned with the end of the first inorganic encapsulation layer in the corner portion.

Features of embodiments of the invention other than those described above will become apparent from the following drawings, claims, and detailed description of the disclosure.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
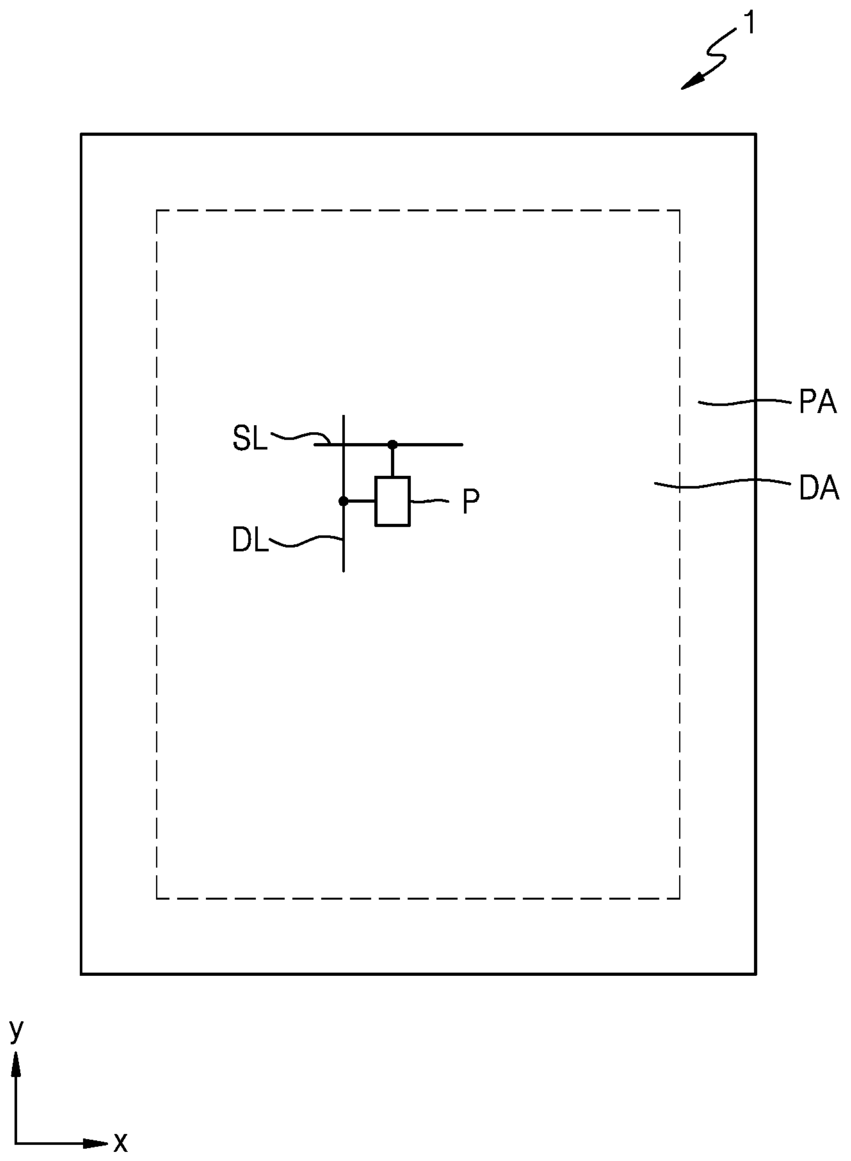
FIG. 1 is a plan view schematically illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b, or c" or "at least one selected from a, b, and c" indicates only a, only b, only c, both a and b, both a and c, both b and c, all of a, b, and c, or any variations thereof.

As the disclosure allows for various changes and numerous embodiments, certain embodiments will be illustrated in the drawings and described in detail in the written description. Hereinafter, effects and features of the disclosure and a method for accomplishing them will be described more fully with reference to the accompanying drawings, in which embodiments of the disclosure are shown. This disclosure may, however, be embodied in many different forms and should not be construed as limited to the embodiments set forth herein.

In an embodiment below, terms such as "first" and "second" are used herein merely to describe a variety of elements, but the elements are not limited by the terms. Such terms are used only for the purpose of distinguishing one element from another element.

In an embodiment below, it will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or element is referred to as being "on" another layer, region, or element, it can be directly or indirectly on the other layer, region, or element. That is, for example, intervening layers, regions, or elements may be present.

Sizes of elements in the drawings may be exaggerated or reduced for convenience of explanation. For example, sizes and thicknesses of the elements in the drawings are randomly indicated for convenience of explanation, and thus, the disclosure is not necessarily limited to the illustrations of the drawings.

In the disclosure, "A and/or B" may include "A," "B," or "A and B." In addition, in the disclosure, "at least one of A and B" may include "A," "B," or "A and B."

In the following disclosure, it will be understood that when a line is referred to as "extending in a first direction or a second direction," it cannot only extend in a linear shape, but also can extend in the first direction or the second direction in a zigzag or curved line.

In the following embodiments, when referred to "in a plan view," it means when an object is viewed from above, and when referred to "in a cross-sectional view," it means when a cross-section formed by vertically cutting an object is viewed from the side. In the following embodiments, when referred to "overlapping," it encompasses "planar" overlapping and "cross-sectional" overlapping.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

One or more embodiments of the disclosure will be described below in more detail with reference to the accompanying drawings. Those elements that are the same or are in correspondence are rendered the same reference symbol regardless of the figure number.

FIG. 1 is a plan view schematically illustrating a display apparatus 1 according to an embodiment.

Referring to FIG. 1, an embodiment of the display apparatus 1 may include a display area DA and a peripheral area PA arranged around the display area DA. The peripheral area PA may surround at least a portion of the display area DA. Pixels P may be disposed on the display area DA. The display apparatus 1 may provide an image through light emitted from the pixels P arranged in the display area DA, and the peripheral area PA may be a non-display area in which no image is provided.

Hereinafter, embodiment where the display apparatus 1 is an organic light-emitting display device will be described as an example, but the display apparatus 1 is not limited thereto. In an embodiment, the display apparatus 1 may be an inorganic light-emitting display (or inorganic electroluminescent (EL) display) or a display apparatus, such as a quantum-dot light-emitting display. In an embodiment, for example, an emission layer of a display element provided in the display apparatus 1 may include organic materials, inorganic materials, quantum dots, organic materials and quantum dots, or inorganic materials and quantum dots.

Although FIG. 1 illustrates an embodiment of the display apparatus 1 having a flat display surface, the disclosure is not limited thereto. In an alternative embodiment, the display apparatus 1 may include a three-dimensional display surface or a curved display surface.

in an embodiment where the display apparatus 1 includes a three-dimensional display surface, the display apparatus 1 includes a plurality of display areas indicating different directions, and may include, for example, a polygonal columnar display surface. In an embodiment, where the display apparatus 1 includes a curved display surface, the display apparatus 1 may be implemented in various forms, such as a flexible display apparatus, a foldable display apparatus, and a rollable display apparatus.

FIG. 1 illustrates an embodiment of a display apparatus 1 applicable to a mobile phone terminal. Although not shown, an electronic module, a camera module, a power module, etc. mounted on a main board are arranged together with the display apparatus 1 in a bracket/case, etc., thereby constituting a mobile phone terminal. In particular, the display apparatus 1 may be applied to large-sized electronic apparatuses, such as televisions and monitors, as well as small and medium-sized electronic devices, such as tablets, car navigation devices, game consoles, and smart watches.

Although FIG. 1 illustrates an embodiment where the display area DA of the display apparatus 1 is a rectangle, the shape of the display area DA may be a circle, an ellipse, or a polygon, such as a triangle or a pentagon.

The display apparatus 1 may include pixels P in the display area DA. Each of the pixels P arranged in the display area DA may include an organic light-emitting diode (OLED), and may emit red, green, blue, or white light through the OLED. As described above, the pixel P may be understood as a pixel that emits light of any one color from among red, green, blue, and white.

Each of the pixels P may be electrically connected to a scan line SL extending in a first direction (e.g., x direction) and a data line DL extending in a second direction (e.g., y direction) crossing the first direction (e.g., x direction). A scan signal may be provided to each pixel P through the scan line SL, and a data signal may be provided to each pixel P through the data line DL.

Figure 2:
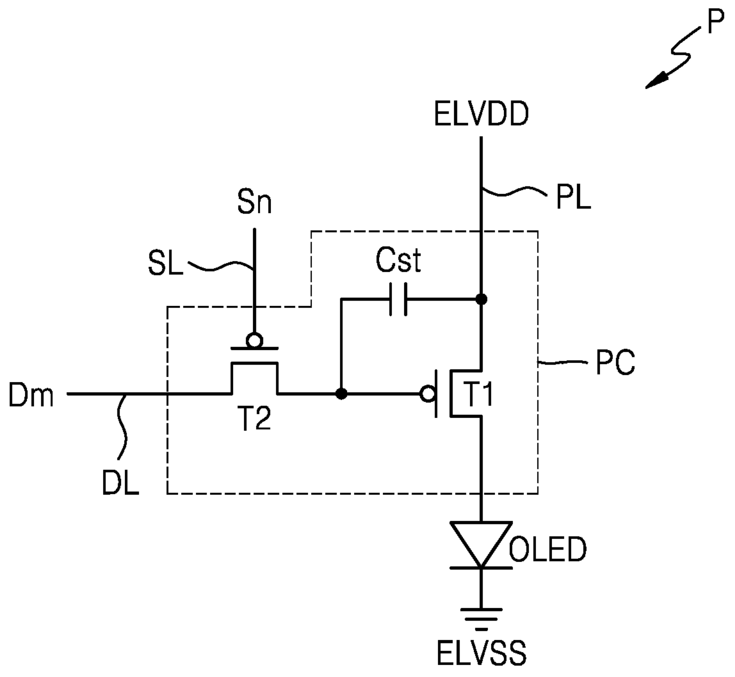
FIGS. 2 and 3 are equivalent circuit diagrams of pixels included in a display apparatus according to an embodiment.
Figure 3:
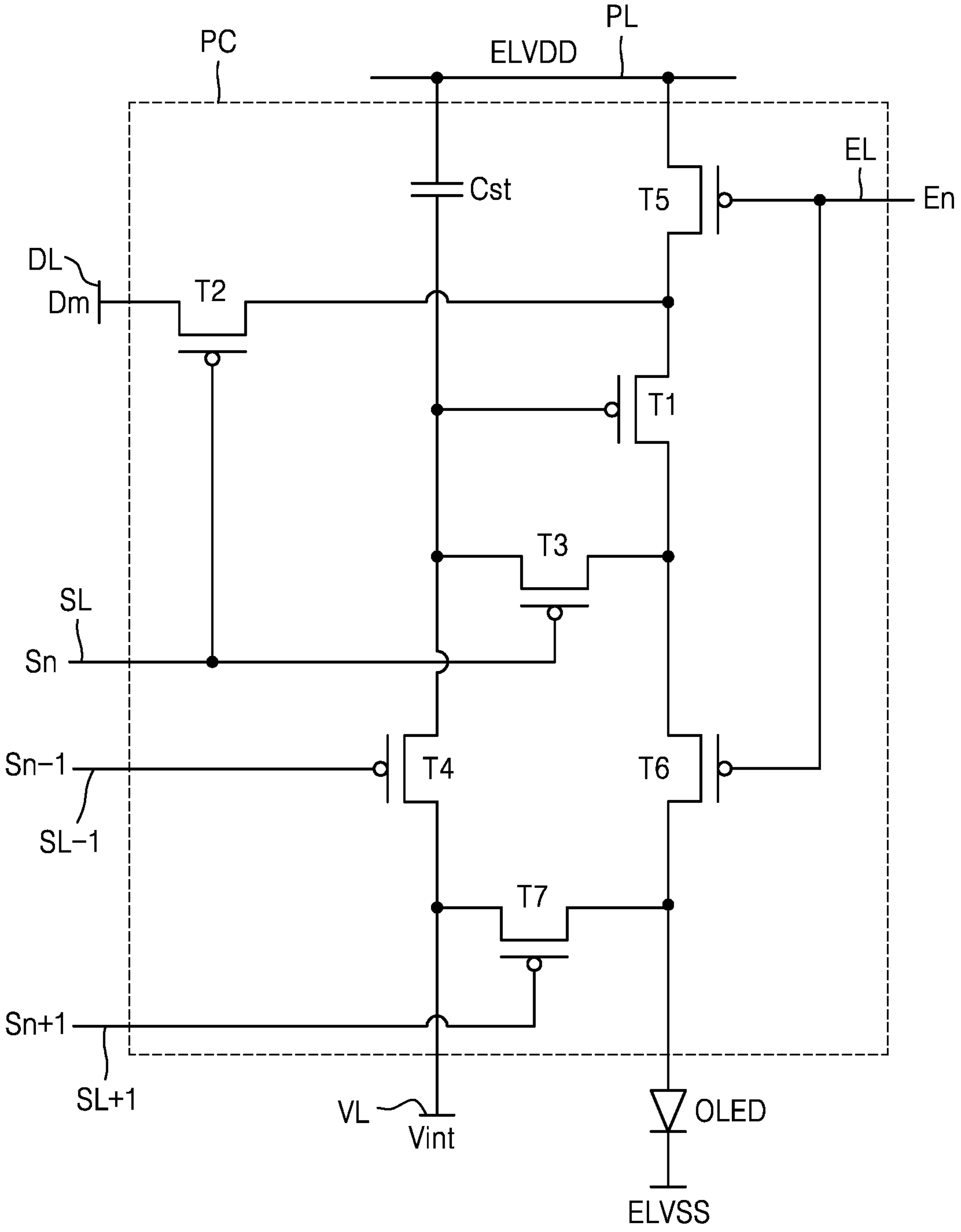

FIGS. 2 and 3 are equivalent circuit diagrams that may be included in a display apparatus, according to an embodiment.

Referring to FIG. 2, an embodiment of each pixel P may include a pixel circuit PC connected to a scan line SL and a data line DL, and an organic light-emitting diode OLED connected to the pixel circuit PC.

The pixel circuit PC may include a driving thin-film transistor T1, a switching thin-film transistor T2, and a storage capacitor Cst. The switching thin-film transistor T2 is connected to the scan line SL and the data line DL, and a data signal Dm input through the data line DL in response to a scan signal Sn input through the scan line SL may be transmitted to the driving thin-film transistor T1.

The storage capacitor Cst is connected to a switching thin-film transistor T2 and a driving voltage line PL, and may store a voltage corresponding to a difference between a voltage received via the switching thin-film transistor and a driving voltage ELVDD supplied to the driving voltage line PL.

The driving thin-film transistor T1 is connected to the driving voltage line PL and a storage capacitor Cst, and may control a driving current flowing from the driving voltage line PL to the organic light-emitting diode OLED to correspond to the voltage value stored in the storage capacitor Cst. The organic light-emitting diode OLED may emit light having a certain luminance according to the driving current.

In an embodiment, as shown in FIG. 2, the pixel circuit PC includes two thin-film transistors and one storage capacitor. However, the disclosure is not limited thereto.

Referring to FIG. 3, in an alternative embodiment, the pixel circuit PC includes a driving thin-film transistor T1, a switching thin-film transistor T2, a compensation thin-film transistor T3, a first initialization thin-film transistor T4, an operation control thin-film transistor T5, an emission control thin-film transistor T5, an emission control thin-film transistor T6, and a second initialization thin-film transistor T7.

In such an embodiment, as shown in FIG. 3, signal lines SL, SL−1, SL+1, EL, and DL, an initialization voltage line VL, and a driving voltage line PL are provided for each pixel circuit PC. However, the disclosure is not limited thereto. In an embodiment, at least one of the signal lines SL, SL−1, SL+1, EL, and DL and/or the initialization voltage line VL may be shared by neighboring pixel circuits.

A drain electrode of the driving thin-film transistor T1 may be electrically connected to the organic light-emitting diode OLED via the emission control thin-film transistor T6. The driving thin-film transistor T1 may receive the data signal Dm according to a switching operation of the switching thin-film transistor T2 and supply driving current to the organic light-emitting diode OLED.

A gate electrode of the switching thin-film transistor T2 may be connected to the scan line SL, and a source electrode may be connected to the data line DL. The drain electrode of the switching thin-film transistor T2 may be connected to the driving voltage line PL via the operation control thin-film transistor T5 while being connected to a source electrode of the driving thin-film transistor T1.

The switching thin-film transistor T2 is turned on in response to a scan signal Sn received via the scan line SL and may perform a switching operation to transmit the data signal Dm received via the data line DL to the source electrode of the driving thin-film transistor T1.

A gate electrode of the compensation thin-film transistor T3 may be connected to the scan line SL. A source electrode of the compensation thin-film transistor T3 may be connected to the pixel electrode of the organic light-emitting diode OLED via the emission control thin-film transistor T6 while being connected to the drain electrode of the driving thin-film transistor T1. A drain electrode of the compensation thin-film transistor T3 may be connected to any electrode of the storage electrode Cst, a source electrode of the first initialization thin-film transistor T4, and the gate electrode of the driving thin-film transistor T1. The compensation thin-film transistor T3 is turned on according to the scan signal Sn received via the scan line SL and connects the gate electrode and drain electrode of the driving thin-film transistor T1 to each other, to diode-connect the driving thin-film transistor T1.

A gate electrode of the first initialization thin-film transistor T4 may be connected to the previous scan line SL−1. A drain electrode of the first initialization thin-film transistor T4 may be connected to the initialization voltage line VL. A source electrode of the first initialization thin-film transistor T4 may be connected to one of the storage capacitor Cst, the drain electrode of the compensation thin-film transistor T3, and the gate electrode of the driving thin-film transistor T1. The first initialization thin-film transistor T4 is turned on according to the previous scan signal Sn−1 received via the previous scan line SL01 and applies an initialization voltage Vint to the gate electrode of the driving thin-film transistor T1, to perform an initialization operation to initialize the voltage of the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 are simultaneously turned on in response to the emission control signal En received via the emission control line EL, and the driving voltage ELVDD is applied to the organic light-emitting diode OLED, and a driving current flows in the organic light-emitting diode OLED.

A gate electrode of the second initialization thin-film transistor T7 may be connected to the next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on according to a next scan signal Sn+1 received via the next scan line SL+1 to initialize the pixel electrode of the organic light-emitting diode OLED.

In an embodiment, as show in FIG. 3, the first initialization thin-film transistor T4 and the second initialization thin-film transistor T7 are respectively connected to the previous scan line SL−1 and the next scan line SL+1. However, the disclosure is not limited thereto. In an alternative embodiment, both the first initialization thin-film transistor T4 and the second initialization thin-film transistor T7 may be connected to the previous scan line SL−1 and driven based on the previous scan signal Sn−1.

Another electrode of the storage capacitor Cst may be connected to the driving voltage line PL. One electrode of the storage capacitor Cst may be connected to the gate electrode of the driving thin-film transistor T1, the drain electrode of the compensation thin-film transistor T3, and the source electrode of the first initialization thin-film transistor T4.

An opposite electrode (e.g., a cathode) of the organic light-emitting diode OLED may receive a common voltage ELVSS. The organic light-emitting diode OLED may emit light by receiving driving current from the driving thin-film transistor T1.

The pixel circuit PC is not limited to the number and circuit design of thin-film transistors and storage capacitors described with reference to FIGS. 2 and 3, and the number and circuit design of thin-film transistors and storage capacitors in the pixel circuit PC may be variously changed.

Figure 4:
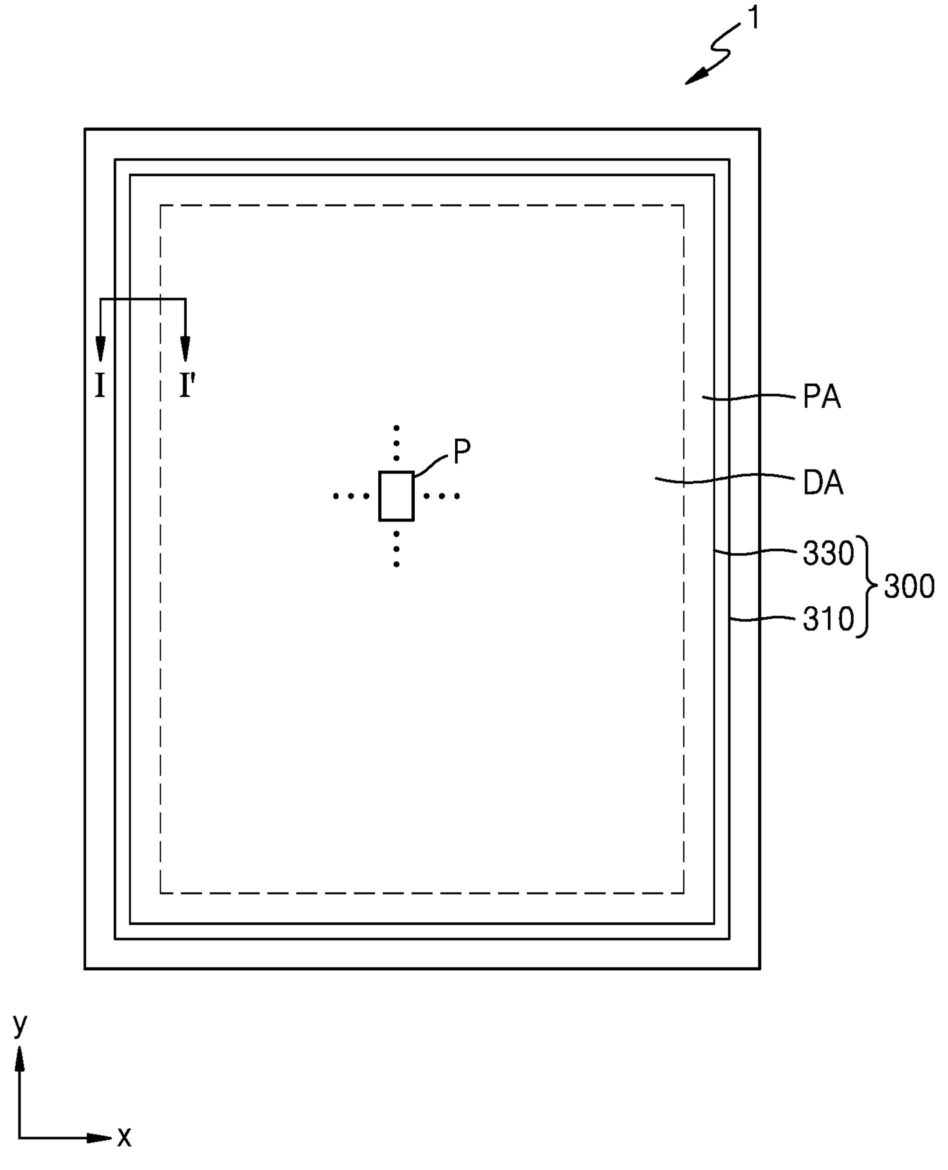
FIG. 4 is a plan view schematically illustrating a display apparatus according to an embodiment.
Figure 5:
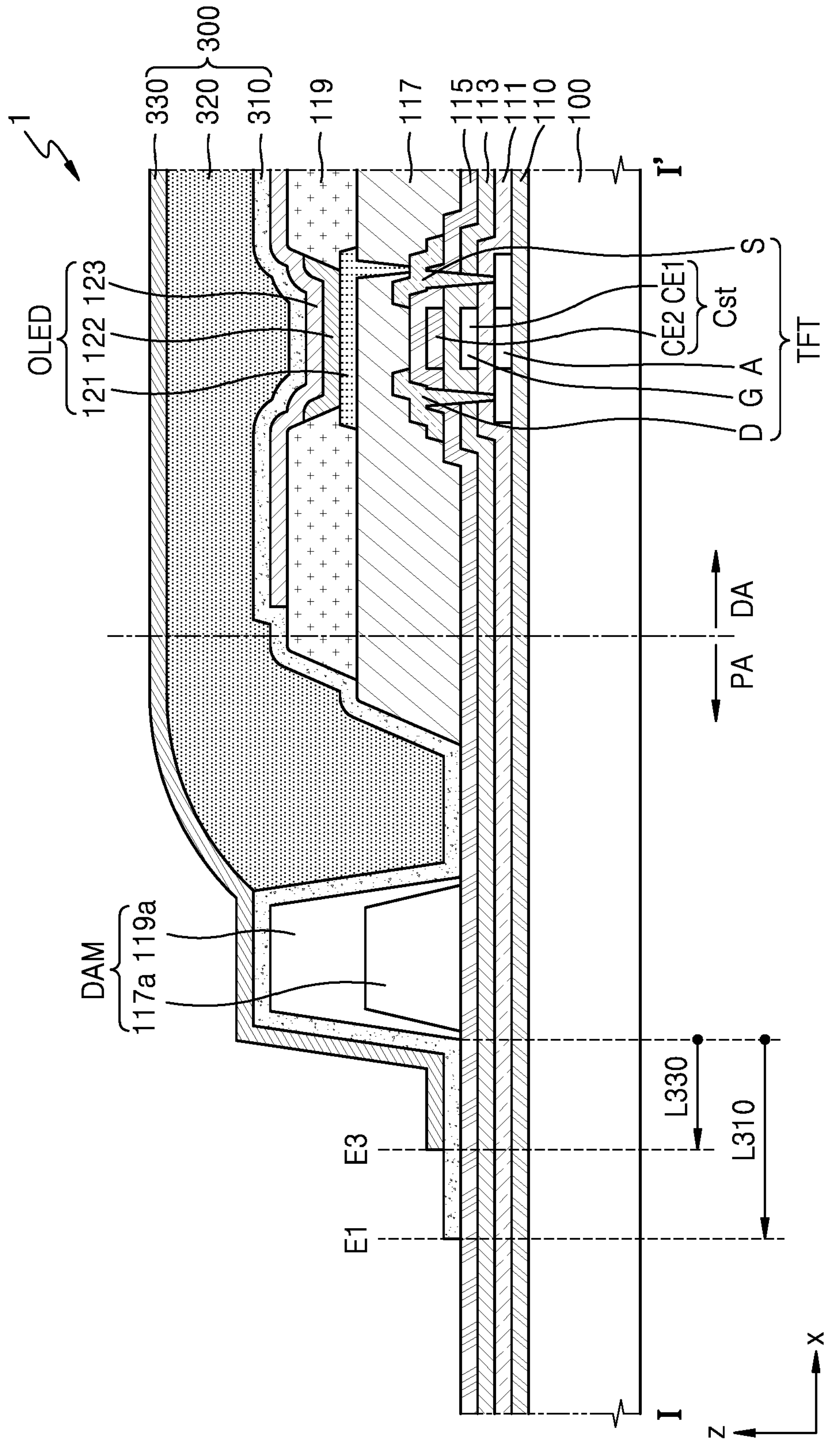
FIGS. 5 and 6A are cross-sectional views schematically illustrating a display apparatus according to an embodiment.

FIG. 4 is a plan view schematically illustrating a display apparatus according to an embodiment, and FIG. 5 is a cross-sectional view schematically illustrating a display apparatus according to an embodiment.

Referring to FIG. 4, an embodiment of the display apparatus 1 may include a display area DA and a peripheral area PA arranged around the display area DA. Pixels P may be arranged in the display area DA.

In an embodiment, the display apparatus 1 may include a thin-film encapsulation layer 300 covering the display area DA. The thin-film encapsulation layer 300 may include a first inorganic encapsulation layer 310 and a second inorganic encapsulation layer 330. An end of the first inorganic encapsulation layer 310 may extend further in a direction from the display area DA toward the peripheral area PA than an end of the second inorganic encapsulation layer 330. The second inorganic encapsulation layer 330 may expose a portion of the first inorganic encapsulation layer 310. This is described below with reference to FIG. 5.

Hereinafter, a structure in which elements included in the display apparatus 1 are stacked is described.

Referring to FIG. 5, an embodiment of the display apparatus 1 may include a substrate 100. In an embodiment, the display apparatus 1 may include a display area DA and a peripheral area PA around the display area DA. In such an embodiment, it can be understood that the substrate 100 of the display apparatus 1 includes the display area DA and the peripheral area PA around the display area DA.

In an embodiment, a thin-film transistor TFT and a display element (e.g., an organic light-emitting diode OLED) may be disposed on the display area DA of the substrate 100. In an embodiment, the thin-film transistor TFT and the display element (e.g., organic light-emitting diode OLED) may be electrically connected to each other.

The substrate 100 may include glass or polymer resin. Polymer resins may include one or more materials selected from polyether sulfone, polyacrylate, polyetherimide, polyethylene naphthalate, polyethylene terephthalate, polyphenylene sulfide, polyarylate, polyimide, polycarbonate, cellulose triacetate, cellulose acetate propionate, and poly (arylene ether sulfone). The substrate 100 may have a multi-layered structure including a layer including the aforementioned polymer resin and an inorganic layer (not shown).

In an embodiment, the substrate 100 may be a flexible substrate that is bendable, foldable, rollable, or the like.

A buffer layer 110 may be disposed on the substrate 100. The buffer layer 110 is positioned on the substrate to reduce or block penetration of foreign matter, moisture, or air from the bottom of the substrate 100 and to provide a flat surface on the substrate 100. The buffer layer 110 may include an inorganic material, such as oxide or nitride, an organic material, or an organic/inorganic composite, and may have a single layer or multi-layer structure of inorganic and organic materials. In an embodiment, for example, the buffer layer 110 may include at least one inorganic insulating material selected from silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta2O_2$), hafnium oxide ($HfO_2$), and zinc oxide ($ZnO_2$). A barrier layer (not shown) may be further included between the substrate 100 and the buffer layer 110 to block permeation of outside air.

The thin-film transistor TFT may be disposed on the buffer layer 110. The thin-film transistor TFT may include a semiconductor layer A, a gate electrode G, a source electrode S, and a drain electrode D.

The semiconductor layer A may be disposed on the buffer layer 110. In an embodiment, the semiconductor layer A may be provided with or include an oxide semiconductor or a silicon semiconductor. In an embodiment, where the semiconductor layer A is provided with an oxide semiconductor, the semiconductor layer A may include an oxide of at least one material selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). In an embodiment, for example, the semiconductor layer A may be InSnZnO (ITZO), InGaZnO (IGZO), or the like. In an embodiment, where the semiconductor layer A is provided with a silicon semiconductor, the semiconductor layer A may include amorphous silicon (a-Si) or low-temperature polysilicon (LTPS) obtained by crystallizing a-Si.

In an embodiment, the semiconductor layer A may include a channel region overlapping the gate electrode G, and a source region and a drain region on opposing sides of the channel region. The source region and the drain region may include higher concentrations of impurities than the channel region. Here, the impurities may include N-type impurities or P-type impurities. The source region and the drain region can be understood as the source electrode S and the drain electrode D of the thin-film transistor TFT, respectively.

A first insulating layer 111 may be disposed on the semiconductor layer A. The first insulating layer 111 may include at least one inorganic insulating layer selected from $SiO_x$, $SiN_x$, $SiO_x N_y$, $Al_2O_3$, $TiO_2$, $Ta_2O_5$, $HfO_2$, or $ZnO_2$. In an embodiment, the first insulating layer 111 may be provided in or defined by a single layer or multiple layers including at least one selected from the aforementioned inorganic insulating materials.

The gate electrode G may be disposed on the first insulating layer 111. The gate electrode G may at least partially overlap the semiconductor layer A disposed thereunder. The gate electrode G may be defined by a single layer or multiple layers of at least one metal selected from among aluminum (Al), platinum (Pt), palladium (Pd), silver (Ag), magnesium (Mg), gold (Au), nickel (Ni), neodymium (Nd), iridium (Ir), Cr, lithium (Li), calcium (Ca), molybdenum (Mo), Ti, tungsten (W), and copper (Cu). The gate electrode G may be connected to a gate line for applying an electrical signal to the gate electrode G.

A second insulating layer 113 may be disposed on the gate electrode G. The second insulating layer 113 may include at least one inorganic insulating material selected from $SiO_x$, $SiN_x$, $SiO_xN_y$, $Al_2O_3$, $TiO_2$, $Ta_2O_5$, $HfO_2$, or $ZnO_2$. In an embodiment, the second insulating layer 113 may be provided in a single layer or multiple layers including at least one selected from the aforementioned inorganic insulating materials.

The storage capacitor Cst may be disposed on the first insulating layer 111. The storage capacitor Cst may include a lower electrode CE1 and an upper electrode CE2 overlapping the lower electrode CE1.

The lower electrode CE1 may be disposed on the first insulating layer 111. In an embodiment, the gate electrode G of the thin-film transistor TFT may be the lower electrode CE1 of the storage capacitor Cst. In such an embodiment, the lower electrode CE1 of the storage capacitor Cst may be integrally provided with the gate electrode G of the thin-film transistor TFT as a single unitary and indivisible part. In an embodiment, the lower electrode CE1 of the storage capacitor Cst may be disposed on the first insulating layer 111 as a separate and independent element from the gate electrode G of the thin-film transistor TFT.

The second insulating layer 113 may be disposed on the lower electrode CE1, and the upper electrode CE2 may be disposed on the second insulating layer 113. In an embodiment, the upper electrode CE2 may at least partially overlap the lower electrode CE1 disposed thereunder. In an embodiment, the lower electrode CE1 and the upper electrode CE2 may at least partially overlap each other with the second insulating layer 113 therebetween.

The upper electrode CE2 may include Al, Pt, Pd, Ag, Mg, Au, Ni, Nd, Ir, Cr, Ca, Mo, Ti, W, and/or Cu, and may be a single layer or multiple layers of at least one selected from the materials described above.

A third insulating layer 115 may be disposed on the storage capacitor Cst. The third insulating layer 115 may include at least one inorganic insulating material selected from $SiO_x$, $SiN_x$, $SiO_x N_y$, $Al_2O_3$, $TiO_2$, $Ta_2O_5$, $HfO_2$, or $ZnO_2$. In an embodiment, the third insulating layer 115 may be provided in a single layer or multiple layers including at least one selected from the aforementioned inorganic insulating materials.

The source electrode S and the drain electrode D may be disposed on the third insulating layer 115. In an embodiment, the source electrode S and/or the drain electrode D may be electrically connected to the source region and/or the drain region disposed thereunder through a contact hole. The source electrode S and the drain electrode D may include a conductive material including Mo, Al, Cu, Ti, or the like, and may include a multi-layer or single-layer including at lest one selected from the materials described above. In an embodiment, the source electrode S and the drain electrode D may have a multi-layer structure of Ti/Al/Ti.

A planarization layer 117 may be disposed on the source electrode S and the drain electrode D. In an embodiment, the planarization layer 117 is disposed on the display area DA, and at least a portion of the planarization layer 117 may extend to the peripheral area PA. In an embodiment, a side surface of the planarization layer 117 may be located in the peripheral area PA.

In an embodiment, the planarization layer 117 may include an organic material or an inorganic material, and may be provided in a single layer or multiple layers. In an embodiment, the planarization layer 117 may include at least one selected from benzocyclobutene (BCB), polyimide (PI), hexamethyldisiloxane (HMDSO), poly(methyl methacrylate) (PMMA), general purpose polymers, such as polystyrene (PS), polymer derivatives having phenolic groups, acrylic polymers, imide polymers arylether polymers, amide polymers, fluorine polymers, p-xylene polymers, vinyl alcohol-based polymers, and any blends thereof. Alternatively, in an embodiment, the planarization layer 117 may include $SiO_x$, $SiN_x$, $SiO_x N_y$, $Al_2O_3$, $TiO_2$, $Ta_2O_5$, $HfO_2$, or $ZnO_2$. After forming the planarization layer 117, chemical mechanical polishing may be performed to provide a flat top surface.

In an embodiment, although not shown, the planarization layer 117 may include a first planarization layer and a second planarization layer. In an embodiment, the first planarization layer and the second planarization layer may be provided with a same material as each other. In an alternative embodiment, the first planarization layer and the second planarization layer may be provided with different materials from each other.

In an embodiment, a display element may be disposed on the planarization layer 117. In an embodiment, the display device may be an organic light-emitting diode OLED. The display element (e.g., an organic light-emitting diode OLED) may include a pixel electrode 121, an emission layer 122, and an opposite electrode 123.

In an embodiment, the pixel electrode 121 may be disposed on the planarization layer 117. The pixel electrode 121 may be a (semi-)transmissive electrode or a reflective electrode. The pixel electrode 121 may include a reflective film including Al, Pt, Pd, Ag, Mg, gold (Au), Ni, Nd, Ir, Cr, Li, Ca, Mo, Ti, W, Cu, and a compound thereof, and a transparent or translucent electrode layer formed on the reflective film. The transparent or translucent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO). The pixel electrode 121 may have a stacked structure of ITO/Ag/ITO.

A pixel-defining layer 119 may be disposed on the planarization layer 117. In an embodiment, the pixel-defining layer 119 is disposed on the display area DA, and at least a portion of the pixel-defining layer 119 may extend to the peripheral area PA. In an embodiment, a side surface of the pixel-defining layer 119 may be located in the peripheral area PA.

In an embodiment, an opening exposing at least a portion of the pixel electrode 121 may be defined through the pixel-defining layer 119. An area exposed by the opening of the pixel-defining layer 119 may be defined as an emission area. In addition, the periphery of the emission area is a non-emission area, and the emission area may surround at least a portion of the emission area. In such an embodiment, the display area DA may include emission areas and non-emission areas surrounding them.

The pixel-defining layer 119 increases a distance between the pixel electrode 121 and the opposite electrode 123 above the pixel electrode 121, thereby preventing an arc from occurring at an edge of the pixel electrode 121. The pixel-defining layer 119 may include an organic insulating material, such as PI, polyamide, acrylic resin, BCB, HMDSO, or phenol resin by spin coating or the like. In an embodiment, a spacer (not shown) may be further disposed on the pixel-defining layer 119 to prevent being stamped by a mask.

The emission layer 122 may be disposed on the pixel electrode 121 at least partially exposed by the pixel-defining layer 119. Although not shown, a first functional layer and a second functional layer may be selectively disposed under and over the emission layer 122.

In an embodiment, the first functional layer may be disposed under the emission layer 122, and the second functional layer may be disposed over the emission layer 122. All of the first functional layer and the second functional layer disposed under and over the emission layer 122 may be referred to as organic functional layers.

The first functional layer may include a hole injection layer (HIL) and/or a hole transport layer (HTL), and the second functional layer may include an electron transport layer (ETL) and/or an electron injection layer (EIL).

The emission layer 122 may include an organic material including a fluorescent or phosphorescent material that emits red, green, blue, or white light. The emission layer 122 may include a low-molecular weight organic material or a polymer organic material.

When the emission layer 122 includes a low-molecular organic material, an intermediate layer may have a structure in which an HIL, a HTL, the emission layer 122, an ETL, and an EIL are stacked in a single or complex structure, and the low-molecular weight organic material may include at least one selected from various organic materials, including copper phthalocyanine (CuPc), N,N'-Di(naphthalene-1-yl)-N, N'-diphenyl-benzidine (NPB), and tris-8-hydroxyquinoline aluminum (Alq3).

In an embodiment where the emission layer 122 includes a polymer organic material, the intermediate layer may have a structure including an HTL and the emission layer 122. In such an embodiment, the HTL may include poly(3,4-ethylenedioxythiophene) (PEDOT), and the emission layer 122 may include a polymer material, such as poly-phenylene vinylene (PPV) or polyfluorene. The emission layer 122 may be formed by screen printing, inkjet printing, laser induced thermal imaging (LITI), or the like.

The opposite electrode 123 may be disposed on the emission layer 122. The opposite electrode 123 may be disposed on the emission layer 122 and cover the entire emission layer 122. The opposite electrode 123 may be disposed over the display area DA and cover the entire display area DA. In such an embodiment, the opposite electrode 123 may be integrally formed as a single body over the entire display area to cover the pixels P arranged in the display area DA by using an open mask.

The opposite electrode 123 may include a conductive material having a low work function. In an embodiment, for example, the opposite electrode 123 may include a (semi-) transparent layer including Ag, Mg, Al, Pt, Pd, Au, Ni, Nd, Ir, Cr, Li, Ca, or an alloy thereof. Alternatively, the opposite electrode 123 may further include a layer, such as ITO, IZO, ZnO, or $In_2O_3$, on the (semi-)transparent layer including at least one selected from the above-described materials.

In an embodiment, an upper portion of the organic light-emitting diode OLED may include the thin-film encapsulation layer 300 sealing the display area DA. The thin-film encapsulation layer 300 may protect the organic light-emitting diode OLED from external moisture or oxygen by covering the display area DA. The thin-film encapsulation layer 300 may include at least one inorganic layer and at least one organic layer. In an embodiment, the thin-film encapsulation layer 300 may include a first inorganic encapsulation layer 310, an organic encapsulation layer 320, and a second inorganic encapsulation layer 330.

The first inorganic encapsulation layer 310 covers the opposite electrode 123 and may include ceramic, metal oxide, metal nitride, metal carbide, metal oxynitride, $In_2O_3$, tin oxide ($SnO_2$), ITO, $SiO_x$, $SiN_x$, and/or $SiO_xN_y$. Other layers, such as a capping layer, may be located between the first inorganic encapsulation layer 310 and the opposite electrode 123 as desired. In an embodiment, because the first inorganic encapsulation layer 310 is formed along a structure thereunder, the upper surface of the first inorganic encapsulation layer 310 is not flat, as shown in FIG. 5.

The organic encapsulation layer 320 covers the first inorganic encapsulation layer 310, and unlike the first inorganic encapsulation layer 310, the upper surface thereof may be substantially flat. In an embodiment, for example, the upper surface of the organic encapsulation layer 320 may be substantially flat in a portion corresponding to the display area DA. The organic encapsulation layer 320 may include one or more materials selected from acrylic, methacrylic, polyester, polyethylene, polypropylene, polyethylene terephthalate (PET), polyethylene naphthalate, polycarbonate, PI, polyethylene sulfonate, polyoxymethylene, polyarylate, and HMDSO.

The second inorganic encapsulation layer 330 covers the organic encapsulation layer 320 and may include ceramic, metal oxide, metal nitride, metal carbide, metal oxynitride, $In_2O_3$, $SnO_2$, ITO, $SiO_x$, $SiN_x$, and/or $SiO_xN_y$. The second inorganic encapsulation layer 330 is in contact with the first inorganic encapsulation layer 310 at an edge thereof located outside the display area DA, thereby effectively preventing the organic encapsulation layer 320 from being exposed to the outside.

In an embodiment, as described above, the thin-film encapsulation layer 300 includes the first inorganic encapsulation layer 310, the organic encapsulation layer 320, and the second inorganic encapsulation layer 330, and through such a multi-layer structure, even when cracks occur inside the thin-film encapsulation layer 300, such cracks may be effectively prevented from being connected between the first inorganic encapsulation layer 310 and the organic encapsulation layer 320 or between the organic encapsulation layer 320 and the second inorganic encapsulation layer 330. Through the above, the formation of a path through which moisture or oxygen from the outside penetrates into the display area DA may be effectively prevented or substantially minimized.

A dam portion DAM may be disposed in the peripheral area PA. The dam portion DAM may be disposed along the circumference of the display area DA. In an embodiment, a plurality of dam portions DAM spaced apart from each other may be arranged in the peripheral area PA.

The dam portion DAM may control the flow of materials included in the organic encapsulation layer 320 in a process of forming the thin-film encapsulation layer 300. In an embodiment, for example, the organic encapsulation layer 320 may be formed by applying a monomer on the display area DA through a process, such as inkjet, and then curing the monomer, and the dam portion DAM may control a position of the organic encapsulation layer 320 by controlling the flow of the monomer.

The dam portion DAM may include an insulating material. In an embodiment, for example, the dam portion DAM may include an organic insulating material and may be formed together in a process of forming a plurality of insulating material layers disposed in the display area DA. The dam portion DAM arranged in the peripheral area PA may be formed of a same material and in a same process as the planarization layer 117 and/or the pixel-defining layer 119. In an embodiment, the dam portion DAM may include a first layer 117*a* including a same material as the planarization layer 117, and a second layer 119*a* including a same material as the pixel-defining layer 119.

After the process of forming the planarization layer 117 and/or the pixel-defining layer 119 is performed, the process of forming the thin-film encapsulation layer 300 is performed, so that the first inorganic encapsulation layer 310 and the second inorganic encapsulation layer 330 may be arranged to cover the dam portion DAM. The first inorganic encapsulation layer 310 may be thicker than the second inorganic encapsulation layer 330. In an embodiment, for example, the first inorganic encapsulation layer 310 may have a thickness of about 1 micrometer (μm), and the second inorganic encapsulation layer 330 may have a thickness of about 0.5 μm.

Referring to FIGS. 4 and 5, in an embodiment, an end E1 of the first inorganic encapsulation layer 310 may extend longer (or further) than an end E3 of the second inorganic encapsulation layer 330 in a direction from the display area DA toward the peripheral area PA. The first inorganic encapsulation layer 310 may be arranged wider in an end direction of the substrate 100 than the second inorganic encapsulation layer 330. In relation to the dam portion DAM, the end E3 of the second inorganic encapsulation layer 330 may be located farther from the dam portion DAM than from the end E1 of the first inorganic encapsulation layer 310. A length L310 from the dam portion DAM to the first inorganic encapsulation layer 310 may be greater than a length from the dam portion DAM to the second inorganic encapsulation layer 330.

The first inorganic encapsulation layer 310 may have a higher surface energy than the second inorganic encapsulation layer 330. Surface energy is free energy of a surface, and in a solid, surface energy is determined by intermolecular force, and may mean a force to reduce the surface area. The higher the surface energy, the stronger the tendency to stabilize by making the surface area smaller by being wet with other liquids. In other words, the higher the surface energy, the better the wettability.

In an embodiment where the first inorganic encapsulation layer 310 has a higher surface energy than the second inorganic encapsulation layer 330, the first inorganic encapsulation layer 310 includes silicon oxide ($SiO_x$) or silicon oxynitride ($SiO_xN_y$), and the second inorganic encapsulation layer 330 may include silicon nitride ($SiN_x$), for example.

Figure 6A:
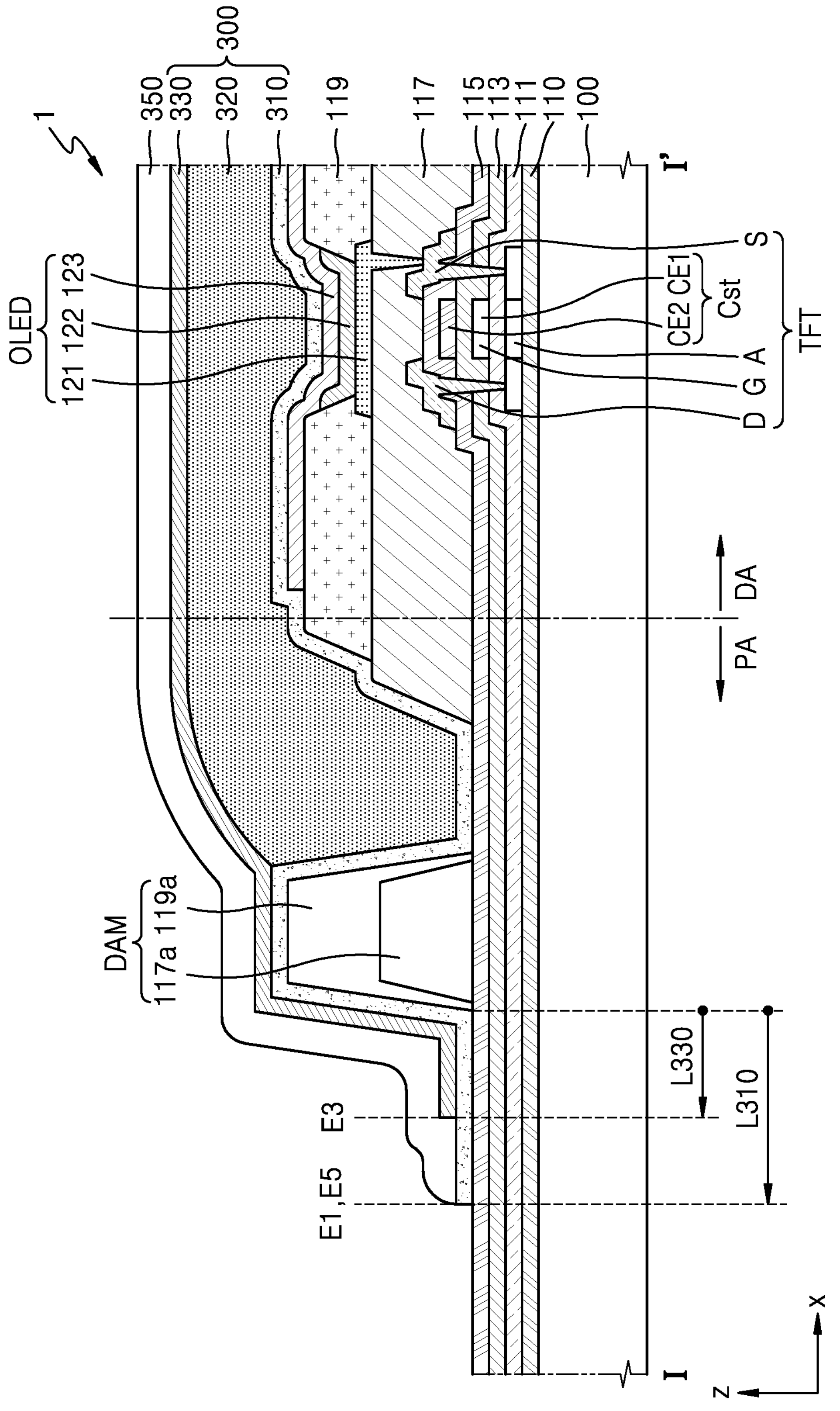
Figure 6B:
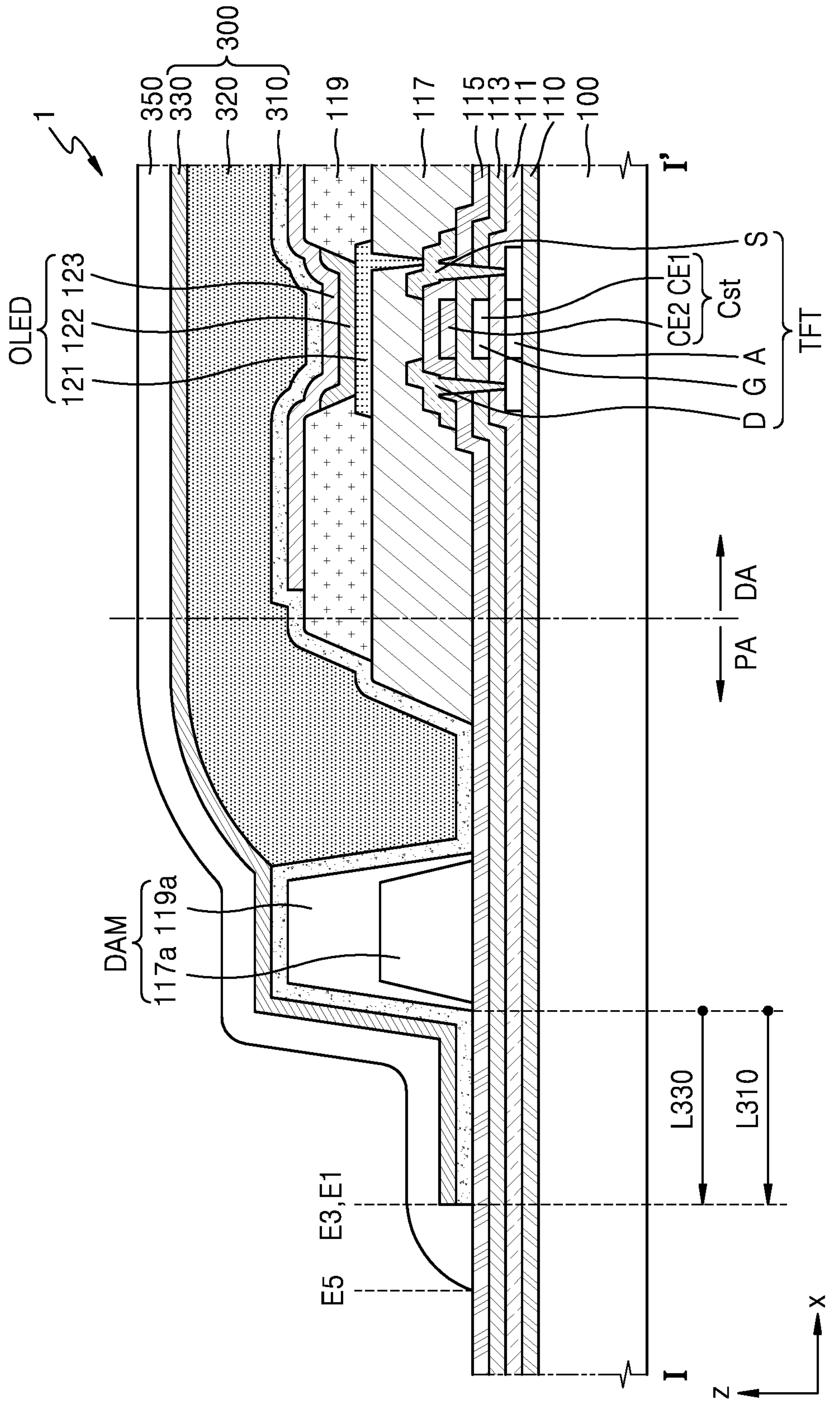
FIG. 6B is a cross-sectional view schematically illustrating a display apparatus according to a comparative example.

FIG. 6A is a schematic cross-sectional view of a display apparatus according to an embodiment, and FIG. 6B is a schematic cross-sectional view of a display apparatus according to a comparative example.

Referring to FIG. 6A, in an embodiment, a coating layer 350 may be disposed on the thin-film encapsulation layer 300. The coating layer 350 may be disposed directly on the second inorganic encapsulation layer 330. The coating layer 350 may be thicker than the first inorganic encapsulation layer 310 and the second inorganic encapsulation layer 330. The coating layer 350 may have a thickness of about 100 μm, for example. The coating layer 350 may serve as a protective layer protecting an upper portion of the thin-film encapsulation layer 300.

The coating layer 350 may include a resin. The coating layer 350 may be formed by coating and curing a liquid resin on the thin-film encapsulation layer 300. In the thin-film encapsulation layer 300 according to an embodiment, the end E1 of the first inorganic encapsulation layer 310 having a higher surface energy than the second inorganic encapsulation layer 330 may extend further than the end E3 of the second inorganic encapsulation layer 330. The second inorganic encapsulation layer 330 may be arranged while exposing the vicinity of an edge of the first inorganic encapsulation layer 310. In such an embodiment, near an edge of the second inorganic encapsulation layer 330, liquid resin may be in contact with the first inorganic encapsulation layer 310 having a high surface energy.

The first inorganic encapsulation layer 310 may have high wettability. The first inorganic encapsulation layer 310 may have high wettability with liquid resin. The first inorganic encapsulation layer 310 may control the spreading of the resin applied to form the coating layer 350. In an embodiment, for example, the resin applied on the thin-film encapsulation layer 300 may flow along an interface of the first inorganic encapsulation layer 310. The resin applied on the thin-film encapsulation layer 300 may spread to the end E1 of the first inorganic encapsulation layer 310. The coating layer 350 may be formed along a shape of the first inorganic encapsulation layer 310. In such an embodiment, as shown in FIG. 6A, an end E5 of the coating layer 350 may coincide or aligned with the end E1 of the first inorganic encapsulation layer 310. Accordingly, the edges of the coating layer 350 may be formed neatly.

FIG. 6B illustrates a schematic cross-section of a comparative example of a display apparatus in which the first inorganic encapsulation layer 310 and the second inorganic encapsulation layer 330 are formed by using a same mask.

In the case of the comparative example, the end E1 of the first inorganic encapsulation layer 310 and the end E3 of the second inorganic encapsulation layer 330 may roughly coincide or aligned with each other, as shown in FIG. 6B showing a cross-section. In this case, the first inorganic encapsulation layer 310 having a relatively high surface energy may not be exposed. In this case, a liquid material applied for forming the coating layer 350 cannot come into contact with the first inorganic encapsulation layer 310 having high wettability. Accordingly, the spreadability of the applied liquid material cannot be controlled.

In addition, even when the same mask is used, the end E1 of the first inorganic encapsulation layer 310 and the end E3 of the second inorganic encapsulation layer 330 may not coincide or aligned with each other in all areas due to a process error. In some areas, the first inorganic encapsulation layer 310 is exposed by the second inorganic encapsulation layer 330, and in other areas, the second inorganic encapsulation layer 330 covers the first inorganic encapsulation layer 310, and the areas are formed randomly. In a plan view, the first inorganic encapsulation layer 310 may be formed in a shape protruding unevenly from an edge of the second inorganic encapsulation layer 330. In particular, when the second inorganic encapsulation layer 330 is provided thinner than the first inorganic encapsulation layer 310, such phenomenon may be intensified.

When a liquid resin for forming the coating layer 350 is applied on the thin-film encapsulation layer 300, the liquid resin may flow only to the end E1 of the first inorganic encapsulation layer 310 in an exposed portion of the first inorganic encapsulation layer 310 having a high surface energy. However, as shown in FIG. 6B, in a portion where the first inorganic encapsulation layer 310 is covered by the second inorganic encapsulation layer 330, the liquid resin flows over the end E3 of the second inorganic encapsulation layer 330 having a low surface energy, or may stop before reaching the end E3. Accordingly, the edges of the coating layer 350 may be formed unevenly.

The coating layer 350 may be removed during manufacturing of the display apparatus. When the liquid resin for forming the coating layer 350 spreads to the end E1 of the first inorganic encapsulation layer 310 in some areas, or spreads before reaching the end E1 of the first inorganic encapsulation layer 310 or even beyond this in other areas, it may be difficult to remove the coating layer 350 that is completed. In other words, when the edges of the coating layer 350 is formed unevenly, it may be difficult to remove the coating layer 350.

In the display apparatus according to an embodiment, the end E1 of the first inorganic encapsulation layer 310 having a higher surface energy than the second inorganic encapsulation layer 330 may extend beyond the end E1 of the second E3 of the second inorganic encapsulation layer 330. Accordingly, because the liquid resin applied on the upper surface of the thin-film encapsulation layer 300 may be controlled to flow to the end E1 of the first inorganic encapsulation layer 310, it may be easy to remove the coating layer 350 that is completed.

The coating layer 350 disposed on the thin-film encapsulation layer 300 may not be removed. When the coating layer 350 is formed beyond an initially intended line (e.g., an edge of the first thin-film encapsulation layer 310 or the second thin-film encapsulation layer 330), a larger margin should be secured in a subsequent process, or dead space may increase.

In the display apparatus according to an embodiment, dead space may be reduced by controlling the liquid resin for forming the coating layer 350 to flow only to the end E1 of the first inorganic encapsulation layer 310.

Figure 7:
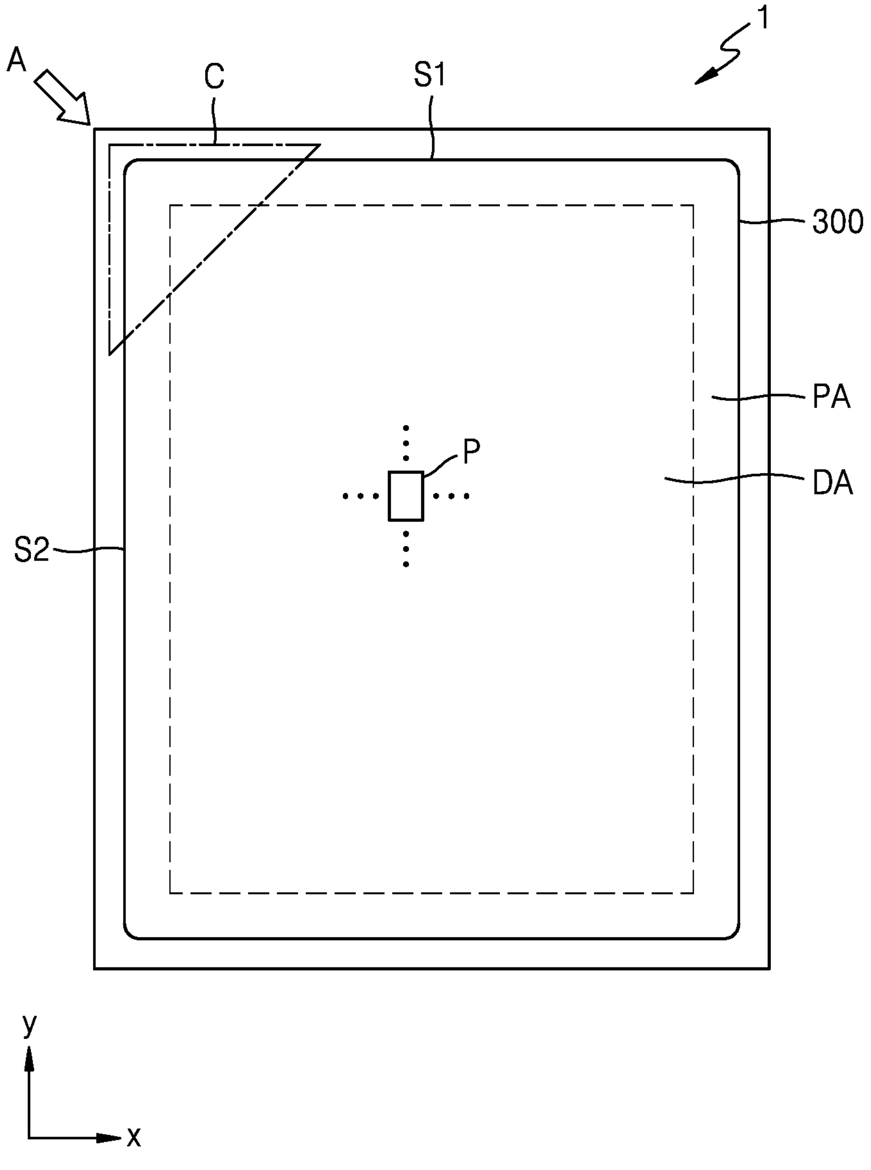
FIG. 7 is a plan view schematically illustrating a display apparatus according to an embodiment.
Figure 8A:
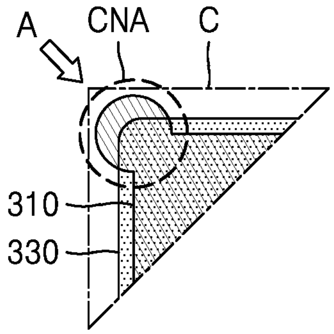
FIGS. 8A, 8B, and 8C are plan views illustrating partially enlarged portions of FIG. 7.
Figure 8B:
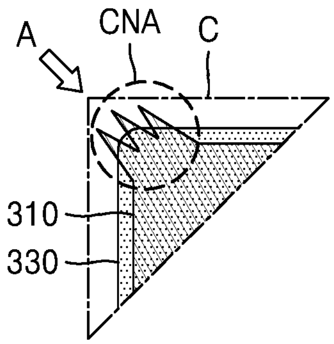
Figure 8C:
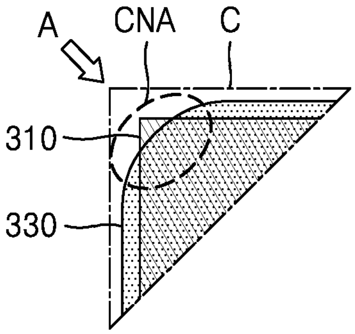

FIG. 7 is a plan view schematically illustrating a display apparatus according to an embodiment. FIGS. 8A, 8B, and 8C are plan views illustrating an enlarged region C of FIG. 7.

Referring to FIG. 7, an edge of the thin-film encapsulation layer 300 may include a first side S1 extending in a first direction (e.g., x direction) and a second side S2 extending in a second direction (e.g., y direction), in a plan view. The thin-film encapsulation layer 300 may include a corner portion CNA where the first side S1 and the second side S2 meet each other. The coating layer 350 described above with reference to FIG. 5 may be peeled along an A direction at the corner portion CNA.

According to an embodiment, as shown in FIG. 5, an area in which the end E1 of the first inorganic encapsulation layer 310 extends further in a direction from the display area DA toward the peripheral area PA than the end of the second inorganic encapsulation layer 330 may be the corner portion CNA of the thin-film encapsulation layer 300.

Referring to FIGS. 8A and 8B, the first inorganic encapsulation layer 310 may have a protruding shape at the corner portion CNA. The first inorganic encapsulation layer 310 may protrude in a round shape, as shown in FIG. 8A, or in a pointed shape, as shown in FIG. 8B. The second inorganic encapsulation layer 330 may cover the first inorganic encapsulation layer 310, but the protruding portion of the first inorganic encapsulation layer 310 may not be covered by the second inorganic encapsulation layer 330. The protruding portion of the first inorganic encapsulation layer 310 may be an area exposed by the second inorganic encapsulation layer 330.

Referring to FIG. 8C, the first inorganic encapsulation layer 310 may have angular corners, and the second inorganic encapsulation layer 330 may have round corners. The second inorganic encapsulation layer 330 may expose angular corners of the first inorganic encapsulation layer 310.

As shown in FIGS. 8A to 8C, the first inorganic encapsulation layer 310 having a relatively high surface energy may be exposed by the second inorganic encapsulation layer 330 only at the corner portion CNA. In other words, at the corner portion CNA, as shown in FIG. 5, the end E1 of the first inorganic encapsulation layer 310 may extend beyond the end E3 of the second inorganic encapsulation layer 330. Accordingly, the end E1 of the coating layer 350 shown in FIG. 6A may coincide with the end E1 of the first inorganic encapsulation layer 310 at the corner portion CNA.

Figure 9:
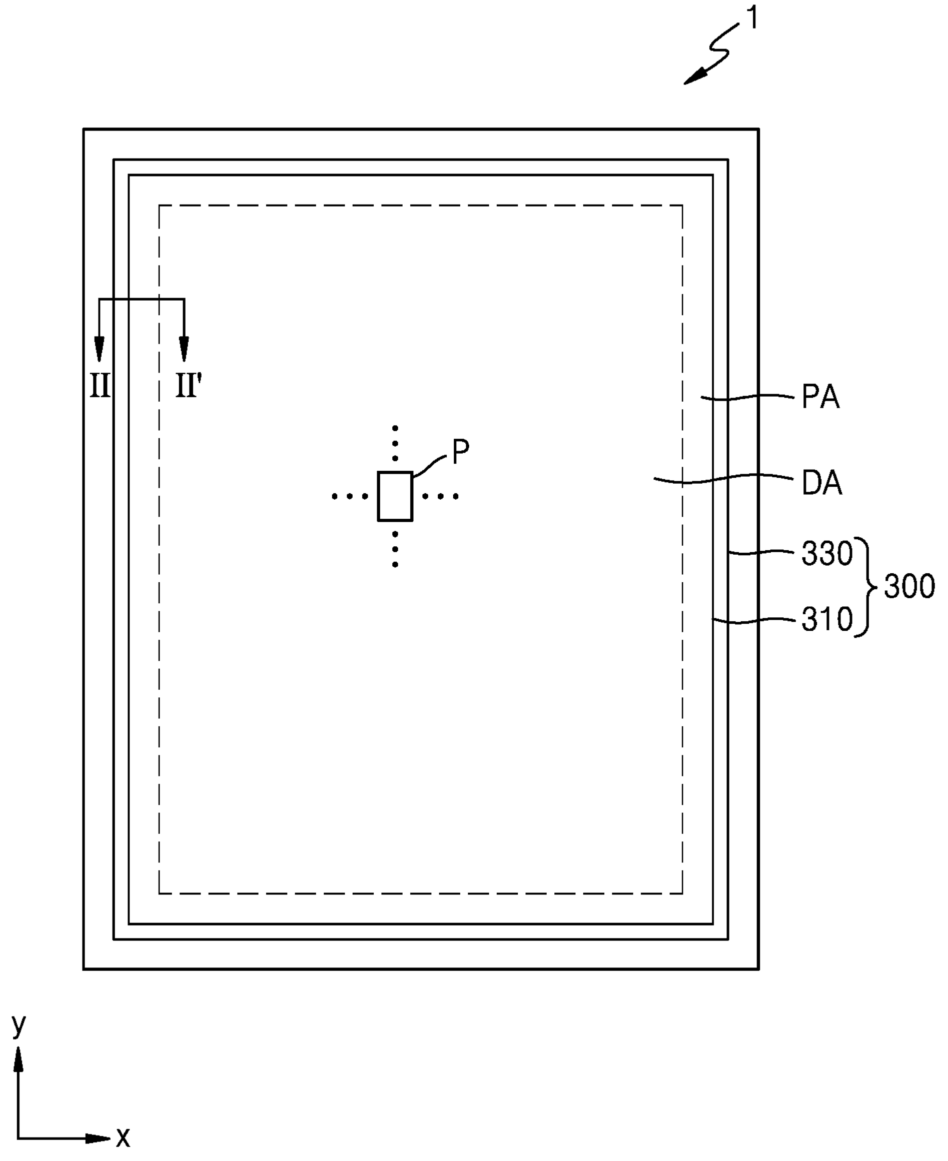
FIG. 9 is a plan view schematically illustrating a display apparatus according to an embodiment.
Figure 10:
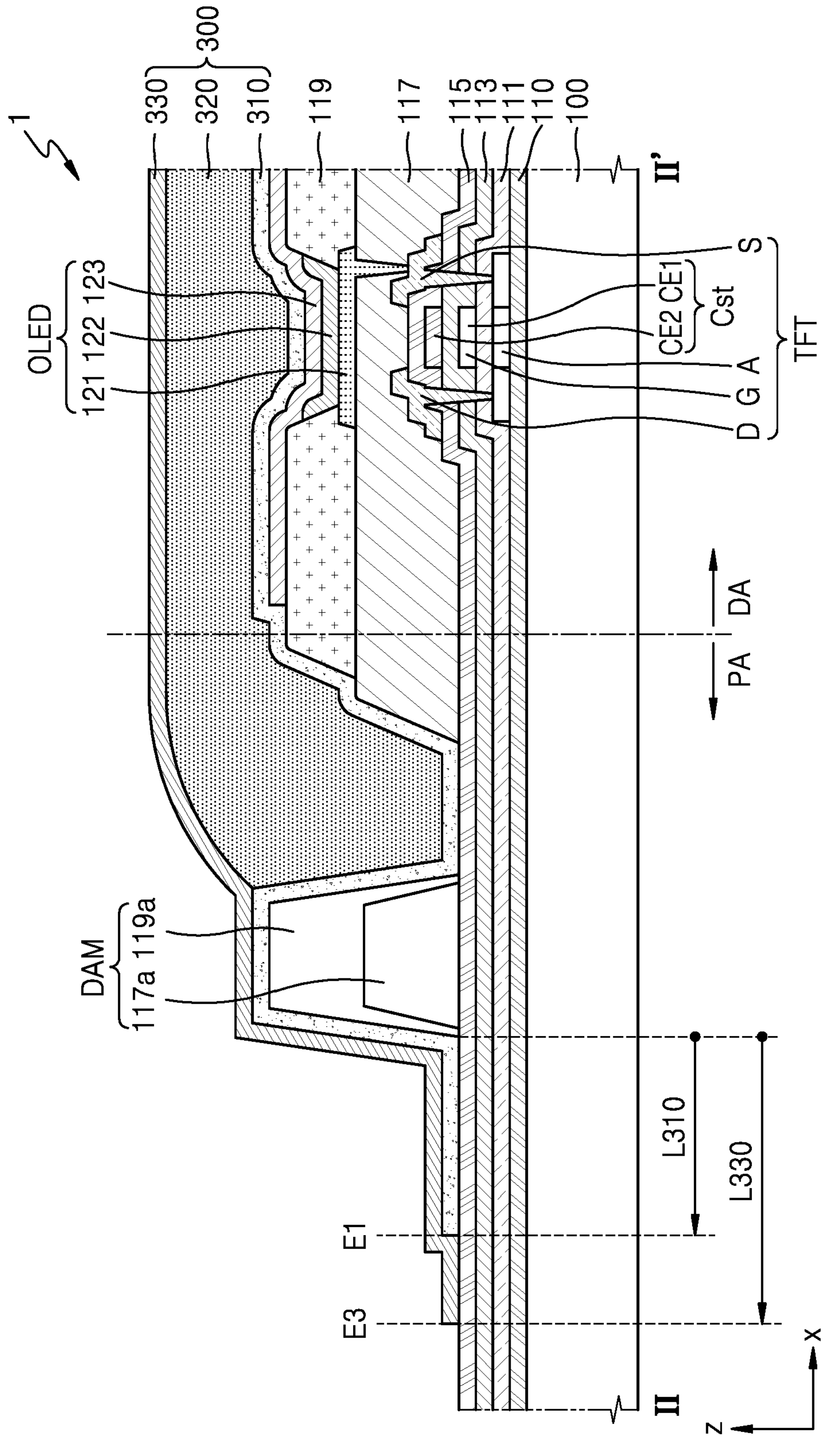
FIGS. 10 and 11 are cross-sectional views schematically illustrating a display apparatus according to an embodiment.
Figure 11:
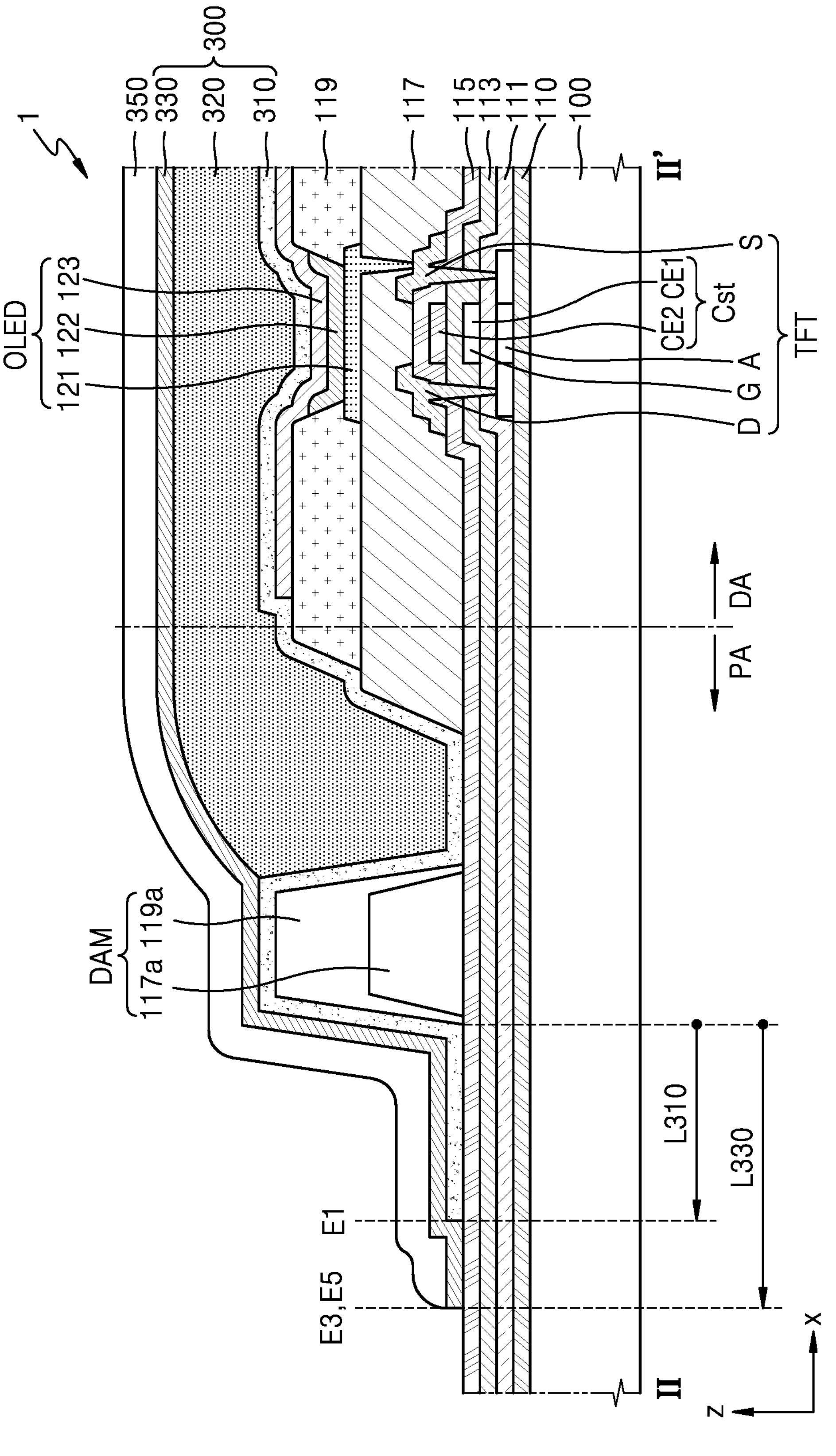

FIG. 9 is a plan view schematically illustrating a display apparatus according to an embodiment, and FIGS. 10 and 11 are cross-sectional views schematically illustrating the display apparatus of FIG. 9. The same reference symbols as those in FIGS. 4 to 6A refer to the same members, and any repetitive detailed descriptions thereof are omitted.

In an embodiment in FIGS. 9 to 11, the second inorganic encapsulation layer 330 may have a higher surface energy than the first inorganic encapsulation layer 310. In such an embodiment, the second inorganic encapsulation layer 330 may have higher wettability than the first inorganic encapsulation layer 310.

In FIGS. 9 and 10, the end E1 of the first inorganic encapsulation layer 310 extends in a direction from the display area DA toward the peripheral area PA than the end E3 of the second inorganic encapsulation layer 330. The second inorganic encapsulation layer 330 may cover the first inorganic encapsulation layer 310 without exposing the first inorganic encapsulation layer 310. In such an embodiment, when a liquid material is applied on the thin-film encapsulation layer 300, the spreading of the material may be controlled by the second inorganic encapsulation layer 330 having a high surface energy. In other words, the material may spread along an interface of the second inorganic encapsulation layer 330

Referring to FIG. 11, the coating layer 350 is disposed on the thin-film encapsulation layer 300. As described above, the coating layer 350 may be formed by coating and then curing a liquid resin on the thin-film encapsulation layer 300. A s shown in FIG. 11, when the second inorganic encapsulation layer 330 having a high surface energy covers the first inorganic encapsulation layer 310, the liquid resin may only come into contact with the second inorganic encapsulation layer 330 at the edge of the second inorganic encapsulation layer 330. The liquid resin may spread only to the end E1 of the second inorganic encapsulation layer 330. The liquid resin may be effectively prevented from spreading until the liquid resin reaches the end E1 of the second inorganic encapsulation layer 330 or overflowing beyond the end E1. Accordingly, the end E1 of the coating layer 350 may coincide with the end E1 of the second inorganic encapsulation layer 330.

In an embodiment shown in FIGS. 9 to 11, the spreading of the liquid resin forming the coating layer 350 may be controlled by using an arrangement relationship between the second inorganic encapsulation layer 330 having a relatively high surface energy and the first inorganic encapsulation layer 310 having a relatively low surface energy. By exposing an inorganic film layer having a high surface energy at the edge of the thin-film encapsulation layer 300, the spreading of the liquid applied on the upper portion of the thin-film encapsulation layer 300 may be controlled.

In FIGS. 5 to 11, an embodiment where the thin-film encapsulation layer 300 includes the first inorganic encapsulation layer 310 and the second inorganic encapsulation layer 330 is shown, for convenience of illustration. However, embodiments are not limited thereto. In an embodiment, for example, the thin-film encapsulation layer may include three or more inorganic encapsulation layers. In such an embodiment, regardless of a stacking order of the inorganic encapsulation layers, an end of an inorganic encapsulation layer having the largest surface energy from among a plurality of inorganic encapsulation layers extends further in a direction toward the peripheral area PA than ends of the other inorganic encapsulation layers. In such an embodiment, because the inorganic encapsulation layer having the largest surface energy from among the plurality of inorganic encapsulation layers is arranged to be exposed to the outermost portion of the thin-film encapsulation layer 300, the reliability of the display apparatus may be improved.

Figure 12:
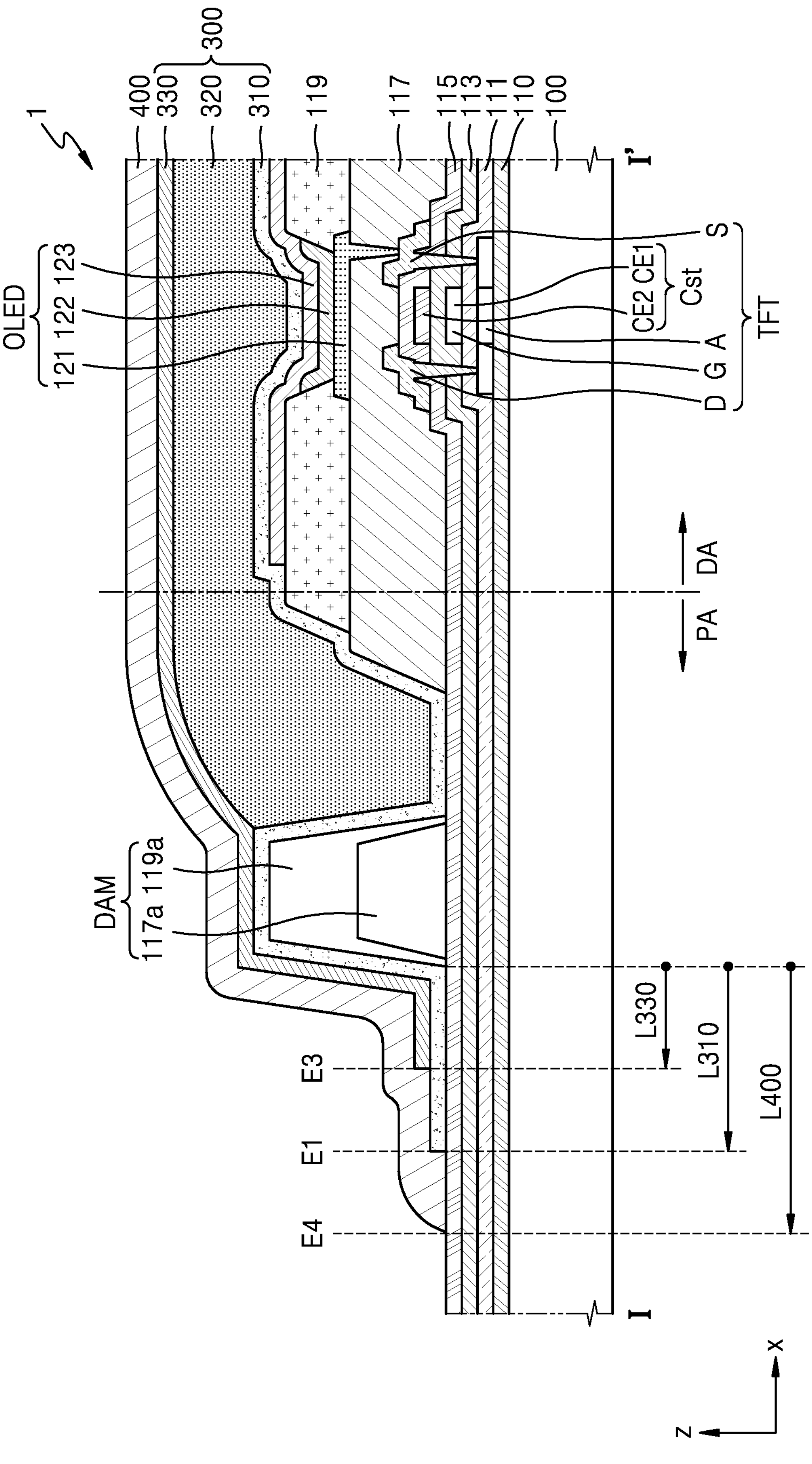
FIG. 12 is a cross-sectional view schematically illustrating a display apparatus according to an embodiment.

FIG. 12 is a schematic cross-sectional view of a display apparatus according to an embodiment. The same reference symbols as those in FIG. 5 refer to the same members, and any repetitive detailed descriptions thereof are omitted.

Referring to FIG. 12, an organic film layer 400 may be disposed on the thin-film encapsulation layer 300. The organic film layer 400 may be an organic insulating layer covering a touch sensing layer (not shown) disposed on the thin-film encapsulation layer 300 in the display area DA. The organic film layer 400 may include an organic insulating material, such as acrylic resin, epoxy resin, PI, or polyethylene. In an embodiment, the organic film layer 400 may include polydiarylsiloxane, methyltrimethoxysilane, or tetramethoxysilane. In an embodiment, the organic film layer 400 may include an acryl-based and/or siloxane-based organic material.

In an embodiment, the organic film layer 400 may have a higher surface energy than the first inorganic encapsulation layer 310 and the second inorganic encapsulation layer 330. In such an embodiment, as shown in FIG. 12, an end E4 of the organic film layer 400 may extend in a direction from the display area DA toward the peripheral area than the end E1 of the first inorganic encapsulation layer 310 and the end E3 of the second inorganic encapsulation layer 330. In relation to the dam portion DAM, the end E4 of the organic film layer 400 may be positioned farther away from the dam portion DAM than the end E1 of the first inorganic encapsulation layer 310 and the end E3 of the second inorganic encapsulation layer 330.

In such an embodiment, the organic film layer 400 may be disposed wider in an end direction of the substrate 100 than the thin-film encapsulation layer 300 including the first inorganic encapsulation layer 310 and the second inorganic encapsulation layer 330. From among the first inorganic encapsulation layer 310, the second inorganic encapsulation layer 330, and the organic film layer 400, which are sequentially stacked, the organic film layer 400 having a relatively high surface energy is arranged to be exposed to the outermost portion, so that the spreading of the liquid material applied in a subsequent process may be controlled. In an embodiment where the first inorganic encapsulation layer 310 or the second inorganic encapsulation layer 330, other than the organic film layer 400, has the largest or highest surface energy, the end of the first inorganic encapsulation layer 310 or the second inorganic encapsulation layer 330 having the largest or highest surface energy may extend farthest toward the peripheral area PA.

According to an embodiment, a display apparatus with improved reliability may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:

a substrate including a display area and a peripheral area around the display area;

a display element disposed on the substrate in the display area; and a thin-film encapsulation layer covering the display element, wherein the thin-film encapsulation layer includes a first inorganic encapsulation layer and a second inorganic encapsulation layer disposed on an upper surface of the first inorganic encapsulation layer, wherein an end of one of the first inorganic encapsulation layer and the second inorganic encapsulation layer extends further in a direction from the display area toward the peripheral area than an end of the other thereof, wherein the one of the first inorganic encapsulation layer and the second inorganic encapsulation layer has a higher surface energy than the other thereof.

2. The display apparatus of claim 1, further comprising:

an organic film layer disposed on the thin-film encapsulation layer and having a higher surface energy than the first inorganic encapsulation layer and the second inorganic encapsulation layer, wherein an end of the organic film layer extends further in a direction from the display area toward the peripheral area than ends of the first inorganic encapsulation layer and the second inorganic encapsulation layer.

3. The display apparatus of claim 1, wherein the first inorganic encapsulation layer has a higher surface energy than the second inorganic encapsulation layer, and the second inorganic encapsulation layer exposes an end portion of the first inorganic encapsulation layer.

4. The display apparatus of claim 3, wherein the first inorganic encapsulation layer includes silicon oxide or silicon oxynitride, and the second inorganic encapsulation layer includes silicon nitride.

5. The display apparatus of claim 1, wherein the first inorganic encapsulation layer is thicker than the second inorganic encapsulation layer.

6. The display apparatus of claim 1, wherein the second inorganic encapsulation layer has a higher surface energy than the first inorganic encapsulation layer, and the second inorganic encapsulation layer covers an end of the first inorganic encapsulation layer.

7. The display apparatus of claim 1, further comprising:

a coating layer disposed directly on the thin-film encapsulation layer, wherein the coating layer includes a resin, wherein an end of the coating layer is aligned with the end of the one of the first inorganic encapsulation layer and the second inorganic encapsulation layer having the higher surface energy.

8. The display apparatus of claim 1, wherein an edge of the thin-film encapsulation layer includes a first side extending in a first direction, a second side extending in a second direction in a plan view, and a corner portion where the first side and the second side meet each other, and the end of the one of the first inorganic encapsulation layer and the second inorganic encapsulation layer having the higher surface energy and extending further in the direction from the display area toward the peripheral area than the end of the other thereof is in the corner portion of the thin-film encapsulation layer.

9. The display apparatus of claim 8, wherein the first inorganic encapsulation layer has a shape protruding from the corner portion of the thin-film encapsulation layer.

10. The display apparatus of claim 8, wherein the first inorganic encapsulation layer has an angular edge and the second inorganic encapsulation layer has a round edge, and the second inorganic encapsulation layer exposes a portion of the angular edge of the first inorganic encapsulation layer.

11. The display apparatus of claim 1, further comprising:

a dam portion disposed on the substrate and positioned in the peripheral area, wherein the first inorganic encapsulation layer and the second inorganic encapsulation layer cover the dam portion.

12. The display apparatus of claim 11, wherein a distance between the end of the one of the first inorganic encapsulation layer and the second inorganic encapsulation layer having the higher surface energy and the dam portion is greater than a distance between the end of the other thereof and the dam portion.

13. The display apparatus of claim 1, wherein the first inorganic encapsulation layer and the second inorganic encapsulation layer are in direct contact with each other in the peripheral area.

14. The display apparatus of claim 1, wherein the display element includes a pixel electrode, an emission layer, and an opposite electrode.

15. A display apparatus comprising:

a substrate including a display area and a peripheral area around the display area;

a display element disposed on the substrate in the display area, wherein the display element includes a pixel electrode, an emission layer, and an opposite electrode;

a thin-film encapsulation layer including a first inorganic encapsulation layer, an organic encapsulation layer, and a second inorganic encapsulation layer, which are sequentially disposed on the display element; and a dam portion disposed on the substrate and positioned in the peripheral area, wherein an edge of the thin-film encapsulation layer includes a first side extending in a first direction, a second side extending in a second direction in a plan view, and a corner portion where the first side and the second side meet each other, and, an end of the first inorganic encapsulation layer in the corner portion extends further in a direction from the display area toward the peripheral area than an end of the second inorganic encapsulation layer in the corner portion.

16. The display apparatus of claim 15, wherein the second inorganic encapsulation layer in the corner portion exposes the first inorganic encapsulation layer in the corner portion.

17. The display apparatus of claim 15, wherein the dam portion is arranged to surround the display area, and, a distance between the end of the second inorganic encapsulation layer in the corner portion and the dam portion is less than a distance between the end of the first inorganic encapsulation layer in the corner portion and the dam portion.

18. The display apparatus of claim 15, wherein the first inorganic encapsulation layer has a higher surface energy than the second inorganic encapsulation layer.

19. The display apparatus of claim 15, wherein the first inorganic encapsulation layer includes silicon oxide or silicon oxynitride, and the second inorganic encapsulation layer includes silicon nitride.

20. The display apparatus of claim 15, further comprising:

a coating layer disposed on the second inorganic encapsulation layer, wherein the coating layer includes a resin, wherein an end of the coating layer is aligned with the end of the first inorganic encapsulation layer in the corner portion.

* * * * *